United States Patent
Tanaka et al.

(10) Patent No.: US 8,815,635 B2
(45) Date of Patent: Aug. 26, 2014

(54) MANUFACTURING METHOD OF PHOTOELECTRIC CONVERSION DEVICE

(75) Inventors: Tetsuhiro Tanaka, Kanagawa (JP); Fumito Isaka, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 13/285,062

(22) Filed: Oct. 31, 2011

(65) Prior Publication Data

US 2012/0115273 A1    May 10, 2012

(30) Foreign Application Priority Data

Nov. 5, 2010 (JP) ................. 2010-248289

(51) Int. Cl.
*H01L 21/00* (2006.01)
*H01L 31/076* (2012.01)

(52) U.S. Cl.
CPC .................... *H01L 31/076* (2013.01)
USPC .................... 438/96; 257/E31.094

(58) Field of Classification Search
CPC . H01L 31/1804; H01L 31/076; H01L 31/202; H01L 31/03762; H01L 31/075
USPC .................... 438/96; 257/E31.094
See application file for complete search history.

(56) References Cited

U.S. PATENT DOCUMENTS

| | | | |
|---|---|---|---|
| 5,308,417 A | 5/1994 | Groechel et al. |
| 5,314,574 A | 5/1994 | Takahashi |
| 5,366,585 A | 11/1994 | Robertson et al. |
| 5,709,757 A | 1/1998 | Hatano et al. |
| 5,763,018 A | 6/1998 | Sato |
| 5,779,803 A | 7/1998 | Kurono et al. |
| 5,834,371 A | 11/1998 | Ameen et al. |
| 5,868,849 A | 2/1999 | Nakao |
| 6,171,662 B1 | 1/2001 | Nakao |
| 6,199,505 B1 | 3/2001 | Sato et al. |
| 6,251,216 B1 | 6/2001 | Okamura et al. |
| 6,283,060 B1 | 9/2001 | Yamazaki et al. |
| 6,344,420 B1 | 2/2002 | Miyajima et al. |
| 6,352,593 B1 | 3/2002 | Brors et al. |
| 6,402,847 B1 | 6/2002 | Takagi et al. |
| 6,499,427 B1 | 12/2002 | Yamazaki et al. |
| 6,984,595 B1 | 1/2006 | Yamazaki |
| 7,329,608 B2 | 2/2008 | Babayan et al. |
| 7,723,218 B2 | 5/2010 | Yamazaki et al. |
| 7,842,586 B2 | 11/2010 | Yamazaki |
| 2001/0004478 A1 | 6/2001 | Zhao et al. |

(Continued)

FOREIGN PATENT DOCUMENTS

| | | |
|---|---|---|
| JP | 11-297496 | 10/1999 |
| JP | 2000-269201 | 9/2000 |
| JP | 2000-277439 | 10/2000 |
| JP | 2004-200345 | 7/2004 |

*Primary Examiner* — Tony Tran
(74) *Attorney, Agent, or Firm* — Nixon Peabody LLP; Jeffrey L. Costellia

(57) ABSTRACT

A photoelectric conversion device has a structure that includes a first amorphous silicon layer and a second amorphous silicon layer that are in contact with a single crystalline silicon substrate, and a first microcrystalline silicon layer with one conductivity type and a second microcrystalline silicon layer with a conductivity type that is opposite the one conductivity type that are in contact with the first and second amorphous silicon layers, respectively. The first and second microcrystalline silicon layers are formed using a plasma CVD apparatus that is suitable for high pressure film formation conditions.

8 Claims, 6 Drawing Sheets

(56) References Cited

U.S. PATENT DOCUMENTS

| | | |
|---|---|---|
| 2008/0231617 A1 | 9/2008 | Miyake et al. |
| 2008/0264337 A1 | 10/2008 | Sano et al. |
| 2009/0197012 A1 | 8/2009 | Yamazaki et al. |
| 2010/0269896 A1* | 10/2010 | Sheng et al. .................. 136/255 |
| 2011/0053357 A1 | 3/2011 | Yamazaki |
| 2011/0056435 A1 | 3/2011 | Yamazaki |
| 2012/0100309 A1 | 4/2012 | Miyairi et al. |
| 2012/0115290 A1 | 5/2012 | Tanaka |

* cited by examiner

MANUFACTURING METHOD OF PHOTOELECTRIC CONVERSION DEVICE

BACKGROUND OF THE INVENTION

1. Field of the Invention

An embodiment of the invention relates to a manufacturing method of a photoelectric conversion device using a single crystalline silicon substrate.

2. Description of the Related Art

In recent years, a photoelectric conversion device that generates electrical power without emitting carbon dioxide has attracted attention as a measure against global warming. As a typical example thereof, a solar battery using a single crystalline silicon substrate is known.

Furthermore, development of a photoelectric conversion device using a crystalline silicon film as a semiconductor film for performing photoelectric conversion is in progress. For example, Patent Document 1 discloses a method of forming a high quality crystalline silicon thin film as the semiconductor film using a plasma CVD apparatus.

REFERENCE

[Patent Document 1] Japanese Published Patent Application No. 2000-277439

SUMMARY OF THE INVENTION

To improve conversion efficiency of a photoelectric conversion device using a single crystalline silicon substrate, it is desirable to lengthen a lifetime of a minority carrier in a photoelectric conversion layer.

In one mode of the present invention, an object is to provide a manufacturing method of a photoelectric conversion device in which the lifetime of the minority carrier in the photoelectric conversion layer is long.

One mode of the present invention disclosed in this specification relates to a manufacturing method of a photoelectric conversion device with a structure that includes a first amorphous silicon layer and a second amorphous silicon layer that are in contact with a single crystalline silicon substrate, and a first microcrystalline silicon layer and a second microcrystalline silicon layer that are in contact with the first and second amorphous silicon layer, respectively.

One mode of the present invention disclosed in this specification is a manufacturing method of a photoelectric conversion device comprising the steps of forming a first amorphous silicon layer over one surface of a single crystalline silicon substrate; forming a first microcrystalline silicon layer with one conductivity type over the first amorphous silicon layer; forming a second amorphous silicon layer over another surface of the single crystalline silicon substrate; and forming a second microcrystalline silicon layer with a conductivity type that is opposite the one conductivity type over the second amorphous silicon layer. In these steps, the first amorphous silicon layer, the second amorphous silicon layer, the first microcrystalline silicon layer, and the second microcrystalline silicon layer are formed over a lower electrode by supplying a film formation gas to a first gas diffusion area from a gas inlet provided in an upper electrode that faces the lower electrode; introducing the film formation gas from the first gas diffusion area to a second gas diffusion area through a diffusion plate provided with a plurality of gas holes that does not face the gas inlet; introducing the film formation gas from the second gas diffusion area to a treatment room through a shower plate; setting pressure inside the treatment room to 10 Pa or higher and 100000 Pa or lower; and generating plasma between the upper electrode and the lower electrode by supplying high-frequency electrical power to the upper electrode.

Note that in this specification and the like, ordinal numbers such as "first", "second", and "third" are used in order to avoid confusion among components, and do not limit the order or number of the components.

A plurality of gas holes is provided in the shower plate, and the number of the holes in the shower plate is preferably more than the number of the holes in the diffusion plate.

Alternatively, a plurality of gas holes is provided in the shower plate, and a total area of the holes in the shower plate is preferably larger than a total area of the holes in the diffusion plate. By having such a structure, a gas can be evenly diffused in the first gas diffusion area.

Furthermore, a thermometer is connected to the upper electrode, and a connection location of the thermometer on the upper electrode is a location that is point symmetric to an inlet of a first gas pipe in the upper electrode with a central point of an electrode plane of the upper electrode as a reference. By having such a structure, evenness of an electric field from the upper electrode can be high.

Also, the upper electrode is preferably provided with a pathway for a cooling medium that bypasses a periphery of the inlet of the first gas pipe in the upper electrode. As the cooling medium, water, oil, or the like can be used for example.

A conductivity type of each of the first and second amorphous silicon layers is i-type, and a conductivity type of the first microcrystalline silicon layer is p-type or n-type. By forming a high quality i-type amorphous silicon over a surface of the single crystalline silicon substrate, surface defects of the single crystalline silicon substrate can be reduced.

Film formation of the first amorphous silicon layer and the second amorphous silicon layer is preferably performed with a pressure of 10 Pa or higher and 100 Pa or lower in the treatment room.

Furthermore, film formation of the first microcrystalline silicon layer and the second microcrystalline silicon layer is preferably performed with a pressure of 450 Pa or higher and 100000 Pa or lower in the treatment room.

By using one mode of the present invention, the lifetime of the minority carrier in the photoelectric conversion layer can be prolonged, and the conversion efficiency of the photoelectric conversion device can be improved.

DETAILED DESCRIPTION OF THE INVENTION

Figure 1:
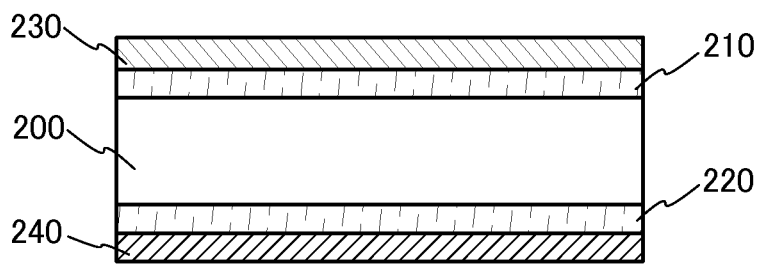
FIG. 1 is a cross-sectional diagram illustrating a photoelectric conversion device that is one mode of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments. Note that in all the drawings for explaining the embodiments, like portions or portions having a similar function are denoted by the same reference numerals, and the description thereof is omitted in some cases.

An example of a cross-sectional diagram of a photoelectric conversion device according to one mode of the present invention is shown in FIG. 1.

The photoelectric conversion device shown in FIG. 1 is formed to include a first amorphous silicon layer 210 and a second amorphous silicon layer 220 that are in contact with a single crystalline silicon substrate 200, and a first microcrystalline silicon layer 230 and a second microcrystalline silicon layer 240 that are in contact with the first and second amorphous silicon layers 210 and 220, respectively.

As in the above structure, by forming high quality i-type amorphous silicon over a surface of the single crystalline silicon substrate, defects on the single crystalline silicon substrate surface can be terminated. Furthermore, by using a high quality film for the microcrystalline silicon layers with a conductivity type for forming a junction, an interface characteristic with the amorphous silicon layers can be made to be favorable. By these effects, recombination of the minority carrier in the photoelectric conversion layer can be reduced and the lifetime of the minority carrier can be lengthened.

Note that a photoelectric conversion layer in this specification refers to a semiconductor region that greatly contributes to photoelectric conversion. In this embodiment, it corresponds to a single crystalline semiconductor region and the amorphous silicon layers that are in contact with the single crystalline semiconductor region.

A manufacturing method of the photoelectric conversion device illustrated in FIG. 1 will be described below.

A conductivity type and a manufacturing method of the single crystalline silicon substrate that can be used in one mode of the present invention are not particularly limited. In this embodiment, an n-type single crystalline silicon substrate manufactured by a MCZ (Magnetic Czochralski) method is used.

First, the first amorphous silicon layer 210 is formed over one surface of the single crystalline silicon substrate 200 using a plasma CVD method. A thickness of the first amorphous silicon layer 210 is preferably 3 nm or more and 50 nm or less. In this embodiment, the first amorphous silicon layer 210 is i-type and the film thickness is 5 nm.

Film formation conditions of the first amorphous silicon layer 210 are that monosilane gas is introduced to a reaction room at a flow rate of 5 sccm or more to 200 sccm, a pressure inside the reaction room is 10 Pa or more and 100 Pa or less, an electrode interval is 15 mm or more and 40 mm or less, and an electrical power density is 8 mW/cm$^2$ or more and 50 mW/cm$^2$ or less.

Next, the first microcrystalline silicon layer 230 is formed over the first amorphous silicon layer 210. The thickness of the first microcrystalline silicon layer 230 is preferably 3 nm or more and 50 nm or less. In this embodiment, the first microcrystalline silicon layer 230 is p-type and the film thickness is 10 nm.

Film formation conditions of the first microcrystalline silicon layer 230 are that monosilane gas with a flow rate of 1 sccm or more to 10 sccm, hydrogen with a flow rate of 100 sccm or more to 5000 sccm, and hydrogen-based diborane (0.1%) with a flow rate of 5 sccm or more and 50 sccm or less are introduced to the reaction room; the pressure inside the reaction room is 450 Pa or more and 100000 Pa or less, preferably 2000 Pa or more and 50000 Pa or less; an electrode interval is 8 mm or more and 30 mm or less, and an electrical power density is 200 mW/cm$^2$ or more and 1500 mW/cm$^2$ or less.

Next, the second amorphous silicon layer 220 is formed over another surface of the single crystalline silicon substrate 200 using a plasma CVD method. The thickness of the second amorphous silicon layer 220 is preferably 3 nm or more and 50 nm or less, and in this embodiment, the second amorphous silicon layer 220 is i-type and the film thickness is 5 nm. Note that the second amorphous silicon layer 220 can be formed under the same film formation conditions as those of the first amorphous silicon layer 210.

Next, the second microcrystalline silicon layer 240 is formed over the second amorphous silicon layer 220. The thickness of the second microcrystalline silicon layer 240 is preferably 3 nm or more and 50 nm or less. In this embodiment, the second microcrystalline silicon layer 240 is n-type and the film thickness is 10 nm.

Film formation conditions of the second microcrystalline silicon layer 240 are that monosilane gas with a flow rate of 1 sccm or more to 10 sccm, hydrogen with a flow rate of 100 sccm or more to 5000 sccm, and hydrogen-based phosphine (0.5%) with a flow rate of 5 sccm or more and 50 sccm or less are introduced to the reaction room; the pressure inside the reaction room is 450 Pa or more and 100000 Pa or less, preferably 2000 Pa or more and 50000 Pa or less; an electrode interval is 8 mm or more and 30 mm or less; and an electrical power density is 200 mW/cm$^2$ or more and 1500 mW/cm$^2$ or less.

Note that in this embodiment, although an RF electrical power source with a frequency of 13.56 MHz is used as an electrical power source in forming the above-described amorphous silicon layers and microcrystalline silicon layers, an RF electrical power source with a frequency of 27.12 MHz, 60 MHz, or 100 MHz may be used instead. Furthermore, film formation may be performed by pulsed discharge as well as with continuous discharge.

Here, a plasma CVD apparatus with which the above-described amorphous silicon layers and microcrystalline silicon layers can be formed to be high quality will be described.

Figure 3A:
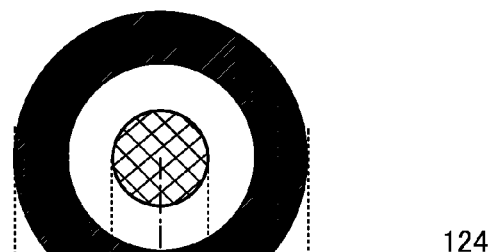
FIGS. 3A and 3B are schematic diagrams of a plasma CVD apparatus that is one mode of the present invention.
Figure 3B:
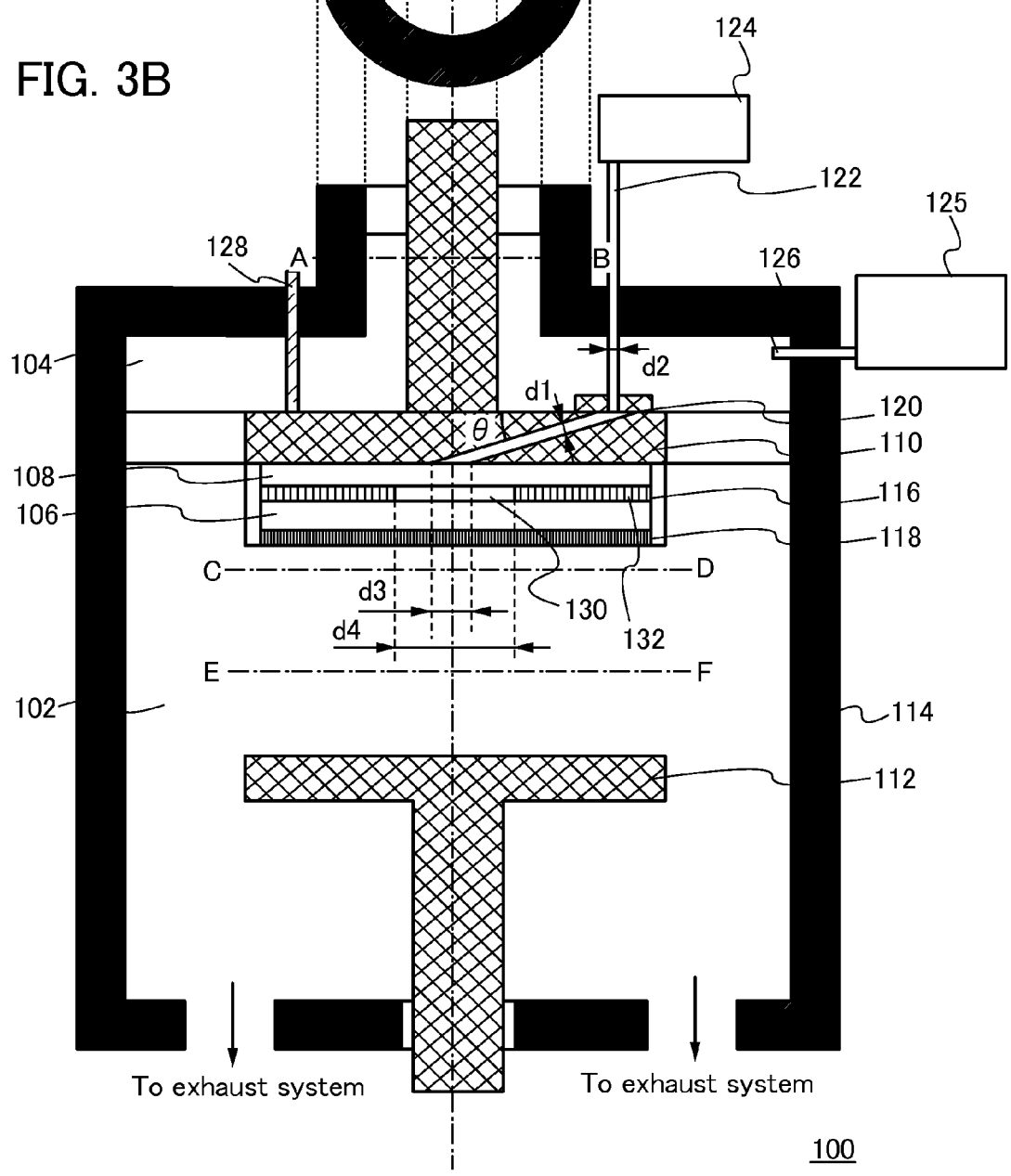

FIGS. 3A and 3B are schematic diagrams illustrating a plasma CVD apparatus that is one mode of the present invention. FIG. 3B illustrates a cross-sectional view of a plasma CVD apparatus 100 in its entirety regarding a main structure, and FIG. 3A illustrates a cross-sectional view across A-B of FIG. 3B.

The plasma CVD apparatus 100 illustrated in FIGS. 3A and 3B has a treatment room 102 and a line room 104. The treatment room 102 is surrounded by a chamber wall 114, and in the treatment room 102, an electrode plane of an upper electrode 110 and an electrode plane of a lower electrode 112 are provided in a manner that face each other. The line room 104 is surrounded by the chamber wall 114 and is separated from the treatment room 102 by the upper electrode 110 and an insulator.

The treatment room 102 is connected to a first gas diffusion area 106 provided between a diffusion plate 116 and a shower plate 118; the first gas diffusion area 106 is connected to a second gas diffusion area 108 provided between the diffusion plate 116 and an electrode plane of the upper electrode 110; the second gas diffusion area 108 is connected to a first gas pipe 120 inside the upper electrode 110; the first gas pipe 120 inside the upper electrode 110 is connected to a second gas pipe 122; and the second gas pipe 122 is connected to a gas supply source 124 for processing.

The line room 104 includes an inlet 126 connected to an inert gas supply source 125, and the upper electrode 110 and the chamber wall 114 that are coaxially provided. The line room 104 preferably has an inert gas atmosphere with a positive pressure.

Note that although "positive pressure" preferably refers to pressure that is higher than atmospheric pressure, it is not limited thereto, and it is acceptable as long as the pressure is at least higher than pressure inside the treatment room.

Here, since inside the line room 104 is an inert gas atmosphere with a positive pressure, corrosion of a part inside the line room 104 can be prevented, maintenance frequency can be reduced, and a Mean Time Between Failure (MTBF) can be increased.

Furthermore, since the upper electrode 110 and the chamber wall 114 have coaxial geometry in the plasma CVD apparatus shown in FIGS. 3A and 3B, a pathway of an inert gas is not blocked. Therefore, uniformity of temperature distribution at the same height is improved at a line portion of the upper electrode 110, and in the case that electrical power supplied to the upper electrode 110 has high frequency, transmission of the electrical power over a surface of the upper electrode can be made to be stable. Accordingly, by the upper electrode 110 and the chamber wall 114 having coaxial geometry, impedance can be reduced and transmission efficiency can be improved. Furthermore, uniformity of distribution of electric field in the upper electrode 110 can be high.

Here, impedance Z is expressed in Numerical Formula 1, where d represents a diameter of the line portion of the upper electrode 110, D represents a diameter inside the chamber wall 114, and ε represents relative permittivity of an atmosphere of the line room 104.

$$Z = \frac{138}{\sqrt{\varepsilon}} \log_{10} \frac{D}{d} \qquad \text{[Numerical Formula 1]}$$

According to above Numerical Formula 1, impedance Z can be reduced by increasing relative permittivity ε. Since the atmosphere of the line room 104 can be selected as appropriate, impedance Z can be reduced by increasing relative permittivity ε. For example, when the atmosphere in the line room 104 is a nitrogen atmosphere, relative permittivity ε=5.47 when a temperature of the atmosphere in the line room 104 is 20° C. Alternatively, when the atmosphere in the line room 104 is an argon atmosphere, relative permittivity ε=5.17 when the temperature of the atmosphere in the line room 104 is 20° C.

Also, since heat removal from a part inside the line room 104 is possible by having an inert gas atmosphere with a positive pressure in the line room 104, even in the case that a heater is provided for the upper electrode 110 for example, the upper electrode 110 can be prevented from being overheated.

Furthermore, by having an inert gas atmosphere with a positive pressure in the line room 104, even in the case that a leak occurs, intrusion of an atmospheric component into the treatment room 102 can be suppressed.

Figure 4:
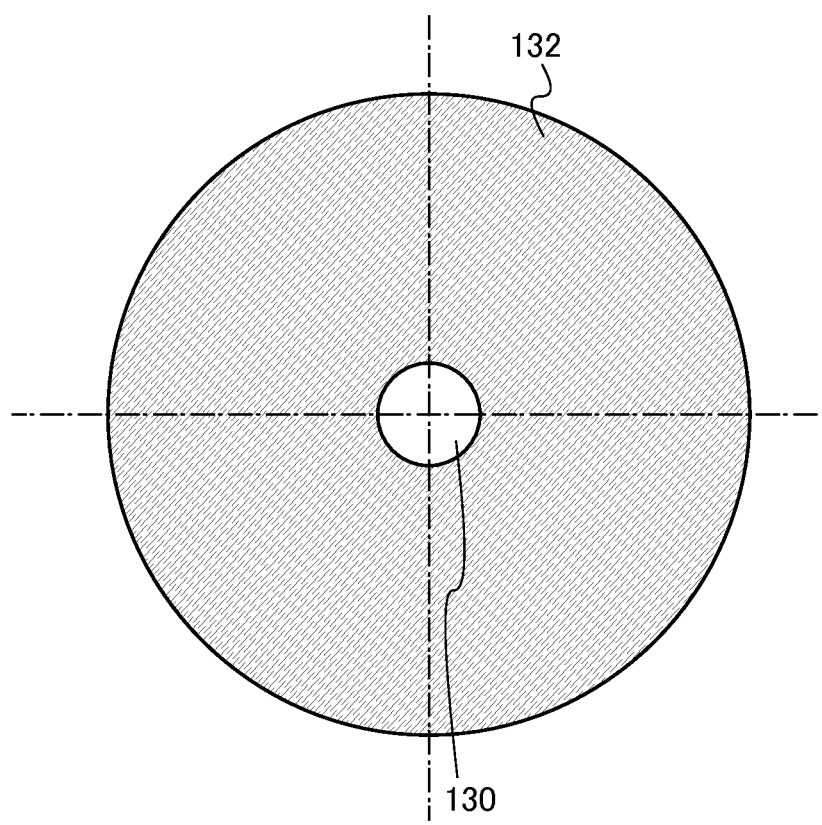
FIG. 4 is a schematic diagram of a diffusion plate of a plasma CVD apparatus that is one mode of the present invention.

FIG. 4 is a schematic of a main surface of the diffusion plate 116. The diffusion plate 116 illustrated in FIG. 4 includes a diffusion plate center portion 130 and a diffusion plate peripheral portion 132. The diffusion plate center portion 130 is a portion provided in a manner that faces a gas vent of the first gas pipe 120 in the upper electrode 110 that is connected to the electrode plane of the upper electrode 110, and is not provided with a gas hole. The diffusion plate peripheral portion 132 is provided with a plurality of gas holes.

Note that the shower plate 118 is provided with a plurality of gas holes, and the number of holes in the shower plate 118 is preferably larger than the number of holes in the diffusion plate 116.

Furthermore, the shower plate 118 is provided with a plurality of gas holes, and the total area of the holes in the shower plate 118 is preferably larger than the total area of the holes in the diffusion plate 116. This is so that a gas can be dispersed evenly in the second gas diffusion area 108.

As described above, since a gas hole is not provided in the diffusion plate center portion 130 of the diffusion plate 116, a gas introduced to the second gas diffusion area 108 from the gas vent of the first gas pipe 120 can be prevented from being introduced to the first gas diffusion area 106 without being sufficiently diffused, and evenness of gas introduced to the treatment room 102 can be improved.

Figure 5:
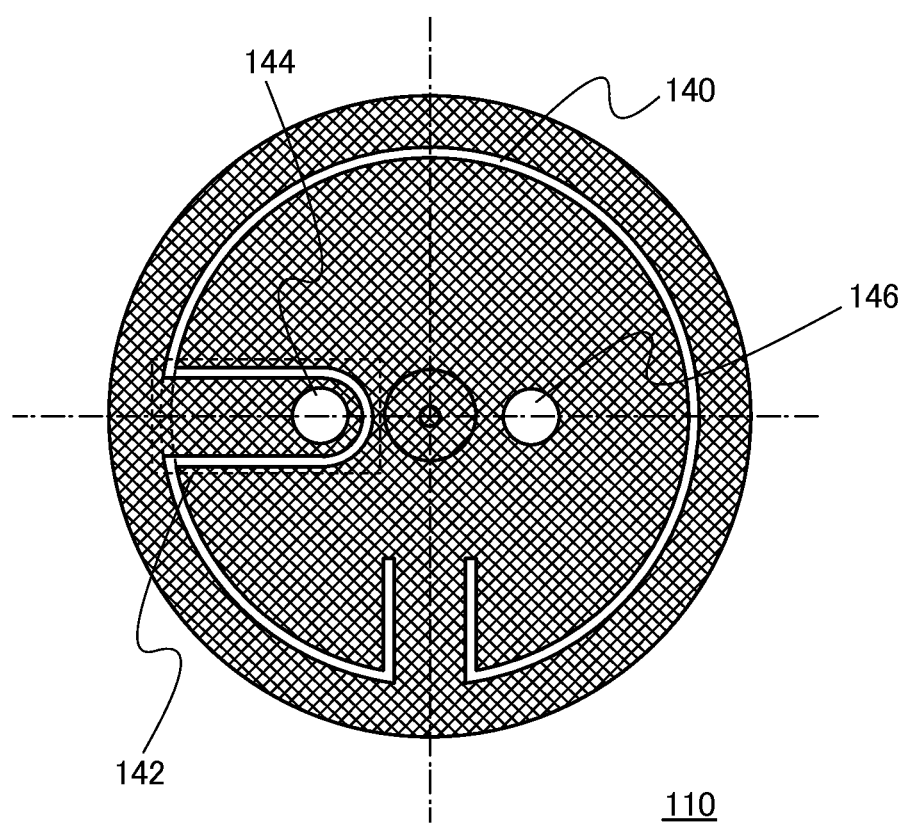
FIG. 5 is a schematic diagram of an electrode plane of an upper electrode of a plasma CVD apparatus that is one mode of the present invention.

FIG. 5 illustrates an example of the electrode plane of the upper electrode 110. Note that FIG. 5 is a diagram with a perspective of looking at the electrode plane of the upper electrode 110 from a side of the lower electrode 112. The upper electrode 110 shown in FIG. 5 is provided with a gas inlet 144 for the first gas pipe 120, a connection location 146 for a thermometer 128, and a cooling medium pathway 140, and the cooling medium pathway 140 includes a bypass portion 142 in a periphery of the gas inlet 144 for the first gas pipe 120.

The connection location 146 for the thermometer 128 is preferably a location that is point symmetric to the gas inlet 144 for the first gas pipe 120 in the upper electrode 110 with a central point of the electrode plane of the upper electrode 110 as a reference. This is so that evenness of an electric field from the upper electrode 110 can be improved.

The bypass portion 142 is preferably provided in a periphery of the gas inlet 144 of the first gas pipe 120. As the cooling medium, water, oil, or the like can be used for example.

Note that the cooling medium pathway 140 is not limited to the embodiment illustrated in FIG. 5. Therefore, the bypass portion 142 does not have to be provided.

It is acceptable as long as a diameter d1 of a cross-section of a main portion of the first gas pipe 120 and a diameter d2 of a cross-section of a main portion of the second gas pipe 122 have sizes that do not cause electrical discharge in the first gas pipe 120 and the second gas pipe 122, respectively, when electrical power is supplied to the upper electrode 110; for example, they may be the substantially the same size.

A diameter d3 of the gas vent of the first gas pipe 120 is expressed by d3=d1/sin θ, where θ represents an angle formed by the electrode plane of the upper electrode 110 and the first gas pipe 120. However, the diameter d3 of the gas vent of the first gas pipe 120 may be provided so that a portion (particularly an end portion) is enlarged. Note that the diameter d3 of the gas vent of the first gas pipe 120 is also to have a size that does not cause electrical discharge.

A diameter d4 of the diffusion plate center portion 130 is preferably larger than the diameter d3 of the gas vent of the first gas pipe 120. This is so that a gas discharged from the gas vent of the first gas pipe 120 is prevented from being introduced to the first gas diffusion area 106 without being diffused.

Figure 6A:
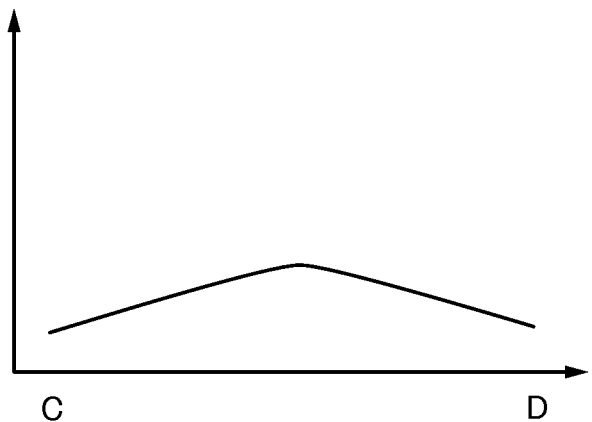
FIG. 6A to 6C are conceptual diagrams illustrating distribution of electric field intensity in a plasma CVD apparatus that is one mode of the present invention.
Figure 6B:
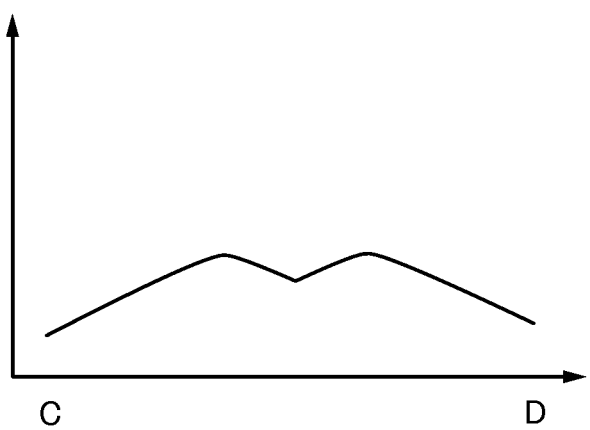
Figure 6C:
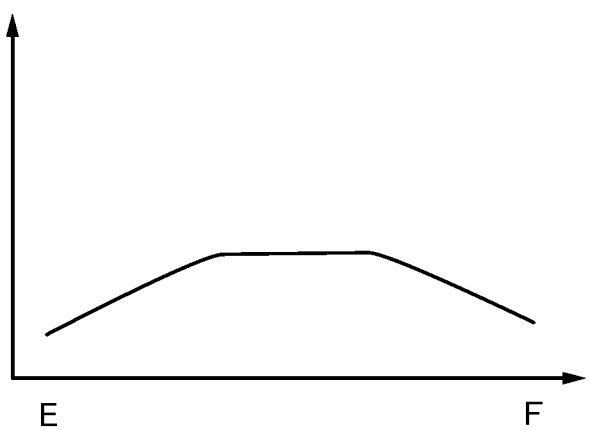

FIGS. 6A to 6C are conceptual diagrams illustrating a distribution of electric field intensity across C-D (FIG. 6A), a distribution of a treatment gas across C-D (FIG. 6B), and a distribution of a reactive substance across E-F (FIG. 6C), when the treatment gas is introduced to the treatment room 102 and a voltage is applied to the upper electrode 110 and the lower electrode 112 in the plasma CVD apparatus 100 of FIGS. 3A and 3B.

As shown in FIG. 6A, although the electric field intensity has a peak at a location that overlaps with a center portion of the upper electrode 110 and the lower electrode 112, a gradient thereof is gradual since evenness of the electric field intensity is high in the plasma CVD apparatus 100 shown in FIGS. 3A and 3B. Furthermore, as shown in FIG. 6B, distribution of the treatment gas has two peaks that avoid a location that overlaps with the diffusion plate center portion 130.

From the electric field intensity shown in FIG. 6A and the distribution of the treatment gas shown in FIG. 6B, the reactive substance (ionized material substance) has a distribution as shown in FIG. 6C. Since the reactive substance (ionized material substance) is distributed in a manner as shown in FIG. 6C, in the case of forming a film over a substrate using the plasma CVD apparatus 100, unevenness of film thickness over a substrate surface can be small and a film with high evenness can be formed. Furthermore, the plasma CVD apparatus 100 can be used as a plasma treatment apparatus capable of performing a plasma treatment with high evenness on a substrate.

Accordingly, a photoelectric conversion device including high quality amorphous silicon layers and microcrystalline silicon layers can be manufactured. Note that FIG. 1 illustrates an example of a basic structure of the photoelectric conversion device according to one mode of the present invention, and a light-transmitting conductive film, an electrode, or the like may be added.

Figure 2A:
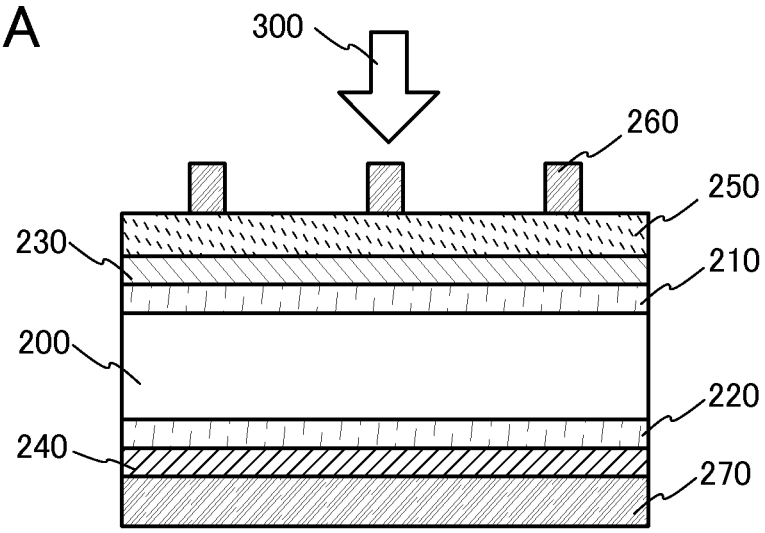
FIGS. 2A and 2B are cross-sectional diagrams illustrating a photoelectric conversion device that is one mode of the present invention.

For example, as shown in FIG. 2A, the structure can be one in which a light-transmitting conductive film 250 and a grid electrode 260 are provided over the first microcrystalline silicon layer 230, and a rear surface electrode 270 is provided over the second microcrystalline silicon layer 240. In the structure shown in FIG. 2A, a light 300 enters from a first microcrystalline silicon layer 230 side.

Figure 2B:
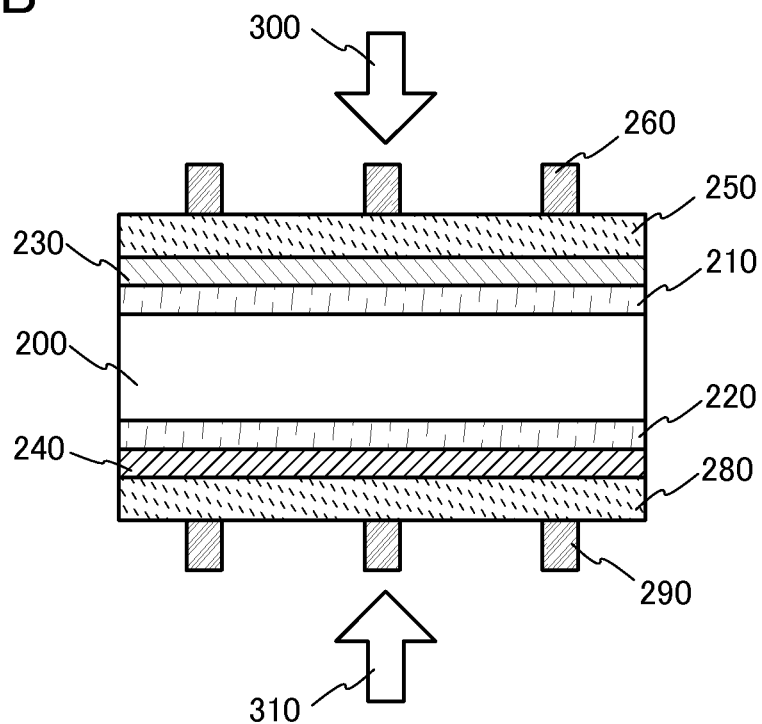

Also, as shown in FIG. 2B, a light-transmitting conductive film 280 and a grid electrode 290 can also be provided on a second microcrystalline silicon layer 240 side. In the structure shown in FIG. 2B, since the light 300 enters from the first microcrystalline silicon layer 230 side and a light 310 enters from the second microcrystalline silicon layer 240 side, more light can be brought into a photoelectric conversion layer, and conversion efficiency can be improved compared to the structure shown in FIG. 2A.

For the light-transmitting conductive films 250 and 280, the following can be used: indium tin oxide (ITO); indium tin oxide containing silicon (ITSO); indium oxide containing zinc (IZO); zinc oxide (ZnO); zinc oxide containing gallium (GZO); zinc oxide containing aluminum (AZO); tin oxide ($SnO_2$); tin oxide containing fluorine (FTO); tin oxide containing antimony (ATO); or the like. Also, each of the light-transmitting conductive films 250 and 280 are not limited to being a single layer, and may be a lamination of different films. For example, a lamination of an ITO film and an AZO film, a lamination of an ITO film and an FTO film, or the like can be used. A total film thickness is to be 10 nm or more and 1000 nm or less. Furthermore, although not shown in the figure, surfaces of the light-transmitting conductive films 250 and 280 may have a textured structure so as to have a reflection preventing effect.

Furthermore, it is preferable to use a low resistance metal such as silver, aluminum, or copper for the grid electrode 260 and the rear surface electrode 270. Alternatively, a silver paste, a copper paste, or the like may be used, with which the grid electrode 260 and the rear surface electrode 270 can be formed using a screen printing method.

Accordingly, in the photoelectric conversion device that is formed using the manufacturing method according to one mode of the present invention, the lifetime of the minority carrier in the photoelectric conversion layer can be prolonged, and the conversion efficiency can be improved.

This application is based on Japanese Patent Application serial no. 2010-248289 filed with Japan Patent Office on Nov. 5, 2010, the entire contents of which are hereby incorporated by reference.

What is claimed is:

1. A manufacturing method of a photoelectric conversion device comprising the steps of:
    forming a first amorphous silicon layer over one surface of a single crystalline silicon substrate;
    forming a first microcrystalline silicon layer with one conductivity type over the first amorphous silicon layer;
    forming a second amorphous silicon layer over another surface of the single crystalline silicon substrate; and
    forming a second microcrystalline silicon layer with a conductivity type that is opposite to the one conductivity type over the second amorphous silicon layer,
    wherein the first amorphous silicon layer, the second amorphous silicon layer, the first microcrystalline silicon layer, and the second microcrystalline silicon layer are formed over a lower electrode by the steps of:
    introducing a film formation gas to a treatment room from a gas inlet of a gas pipe provided in an upper electrode that faces the lower electrode through a first gas diffusion area, a diffusion plate, a second gas diffusion area, and a shower plate in this order;
    adjusting pressure inside the treatment room; and
    supplying high-frequency electrical power to the upper electrode to generate plasma between the upper electrode and the lower electrode,
    wherein the diffusion plate is located between the upper electrode and the shower plate,
    wherein the first gas diffusion area is located between the upper electrode and the diffusion plate, and
    wherein the second gas diffusion area is located between the diffusion plate and the shower plate.

2. The manufacturing method of the photoelectric conversion device according to claim 1, wherein the shower plate is provided with a plurality of gas holes, and the number of the gas holes in the shower plate is larger than the number of the gas holes in the diffusion plate.

3. The manufacturing method of the photoelectric conversion device according to claim 1, wherein the shower plate is provided with a plurality of gas holes, and a total area of the gas holes in one main surface of the shower plate is larger than a total area of the gas holes in one main surface of the diffusion plate.

4. The manufacturing method of the photoelectric conversion device according to claim 1, wherein a thermometer is connected to the upper electrode, and a connection location of the thermometer on the upper electrode is a location that is point symmetric to the gas inlet of the gas pipe in the upper electrode with a central point of an electrode plane of the upper electrode as a reference.

5. The manufacturing method of the photoelectric conversion device according to claim 1, wherein the upper electrode is provided with a pathway for a cooling medium that bypasses a periphery of the gas inlet of the gas pipe in the upper electrode.

6. The manufacturing method of the photoelectric conversion device according to claim 1, wherein a conductivity type of each of the first and second amorphous silicon layers is i-type, and a conductivity type of the first microcrystalline silicon layer is p-type or n-type.

7. The manufacturing method of the photoelectric conversion device according to claim 1, wherein formation of the first amorphous silicon layer and the second amorphous silicon layer is performed with a pressure of 10 Pa or higher and 100 Pa or lower in the treatment room.

8. The manufacturing method of the photoelectric conversion device according to claim 1, wherein formation of the first microcrystalline silicon layer and the second microcrystalline silicon layer is performed with a pressure of 450 Pa or higher and 100000 Pa or lower in the treatment room.

* * * * *